United States Patent
Nejati et al.

(10) Patent No.: US 10,057,046 B1
(45) Date of Patent: Aug. 21, 2018

(54) DYNAMIC CALIBRATION FOR TRANSCEIVERS

(71) Applicant: SiTune Corporation, San Jose, CA (US)

(72) Inventors: Hamid Nejati, San Jose, CA (US); Vahid M. Toosi, San Jose, CA (US); Saeid Mehrmanesh, Los Altos, CA (US); Marzieh Veyseh, Los Altos, CA (US)

(73) Assignee: SITUNE CORPORATION, San Jose, CA (US)

( * ) Notice: Subject to any disclaimer, the term of this patent is extended or adjusted under 35 U.S.C. 154(b) by 0 days.

(21) Appl. No.: 15/439,131

(22) Filed: Feb. 22, 2017

(51) Int. Cl.
- *H04L 7/00* (2006.01)
- *H04B 10/2575* (2013.01)
- *H04B 1/40* (2015.01)

(52) U.S. Cl.
CPC ............ *H04L 7/0004* (2013.01); *H04B 1/40* (2013.01); *H04B 10/2575* (2013.01); *H04L 7/0016* (2013.01)

(58) Field of Classification Search
CPC ..................................................... H04L 7/0004
USPC ........................................................... 375/371
See application file for complete search history.

(56) References Cited

U.S. PATENT DOCUMENTS

| | | | | |
|---|---|---|---|---|
| 8,253,463 B1* | 8/2012 | Chromczak | ............ | H03K 3/017 327/172 |
| 9,036,763 B2* | 5/2015 | Burg | ........................ | H03L 7/113 375/354 |
| 2004/0019844 A1* | 1/2004 | Goodnow | ............. | H04L 1/0009 714/798 |
| 2009/0207960 A1* | 8/2009 | Takahashi | ............... | H04L 7/033 375/371 |

\* cited by examiner

*Primary Examiner* — Lihong Yu
(74) *Attorney, Agent, or Firm* — Hogan Lovells US LLP

(57) ABSTRACT

The present disclosure relates to a method and system for calibrating transceivers by providing a stored index that was calculated of a race condition count. The race condition is based at least in part to a rat race between a clock signal and an input signal that has been sampled by a random or jitter signal. The stored index corresponds to a relative timing error between the clock signal and the sampled input signal. The stored index is used to scramble subsequent input signals that are thermo-coded signals, thereby eliminating timing errors.

20 Claims, 8 Drawing Sheets

DYNAMIC CALIBRATION FOR TRANSCEIVERS

TECHNICAL FIELD

The present disclosure generally relates to modem technology and, in particular, to dynamic calibration of transceivers using novel integrated circuits and algorithms.

BACKGROUND

A network for communications, including for cable television, phone, and internet traffic, typically includes a base station, one or more head-ends, one or more intermediate hubs, and the subscriber facilities. The subscriber facilities typically represent the end of the line and include one or more modems, routers, and other consuming technology—such as, phones, televisions, computers, laptops, electronic tablets, smartphones, InternetOfThings (IoT) devices, and other internet-enabled devices.

Communications and related networks, such as the networks described above, utilize one or more devices to communicate data in various forms. In an example of the cable television network, the subscriber side may include transmitting and receiving components—including a modem, a router, and other related equipment. Many of these devices rely on calibration for transmitting signals at high speed and in a seamless manner, via one or more protocols.

Typical calibration techniques attempt to calibrate systems using random prediction and compensation for the timing errors. Techniques that sense timing errors among switches and clock signals use the random calibration techniques, but encounter complexities due to the nature of the timing errors. Pertinently, timing errors in present networks are random and nondeterministic.

SUMMARY

The present disclosure resolves deficiencies in typical processes for dynamic calibration of transceivers in a communications network. Pertinently, the present disclosure relates to calibrating transceivers and associated digital to analog converters (DACs) by providing a stored index, which was calculated of a race condition count. The stored index is used to scramble subsequent input signals that are thermo-coded signals. The race condition is based at least in part to statistical analysis of a rat race between a clock signal and an input signal that has been sampled by a random or a generated jitter signal over a period of time. The stored index corresponds to a relative timing error between the clock signal and the sampled input signal.

In one aspect, the present disclosure is to a method for calibrating a transceiver. The method includes providing a jitter signal to the transceiver. A sampling is performed for an input signal in accordance with the jitter signal to provide sampled input signals. A receiving step is applied at each of a number of electronic elements in a circuit to receive one of the sampled input signals and a clock signal. A determining function is conducted, for each of the plurality of electronic elements, to determine that a rare condition exists between the one sampled input signal and the clock signal. Revision is applied to a count value in accordance with the determination of the race condition for each of the plurality of electronic elements. A calculation is applied, from the count value for each of the plurality of electronic elements, to determine a relative timing error between the respective sampled input signals and the clock signal. A scrambling is performed for the output signals from each of the electronic elements to provide calibrated versions of the sampled input signals. Pertinently, each scrambled output signal corresponds to each sampled input signals and the scrambling is in accordance with an index corresponding to the relative timing error. The index is stored for use with subsequent input signals, thereby calibrating the transceiver.

In another aspect of the present disclosure, a transceiver circuit is disclosed. The transceiver circuit includes a signal generator for providing a jitter signal and a sampler circuit for sampling an input signal in accordance with the jitter signal to provide sampled input signals. A number of electronic elements of the transceiver circuit are provided for receiving one of the sampled input signals and a clock signal. A sensor circuit is provided for determining that a race condition exists between the one sampled input signal and the clock signal for each of the electronic element. The sensor circuit is also for revising a count value in accordance with the determination of the race condition. Further, the sensor circuit provides configuration for calculating, from the count value for each of the electronic elements, a relative timing error between the respective sampled input signals and the clock signal. A scrambler circuit is provided for scrambling output signals from each of the electronic elements to provide calibrated versions of the sampled input signals. Pertinently, each scrambled output signal corresponds to each sampled input signals and the scrambling is in accordance with an index corresponding to the relative timing error. The transceiver circuit stores the index for use with subsequent input signals, thereby calibrating the transceiver.

BRIEF DESCRIPTION OF THE DRAWINGS

The accompanying drawings constitute a part of this specification and, together with the specification, illustrate certain exemplary implementations of this disclosure.

DETAILED DESCRIPTION

Figure 1:
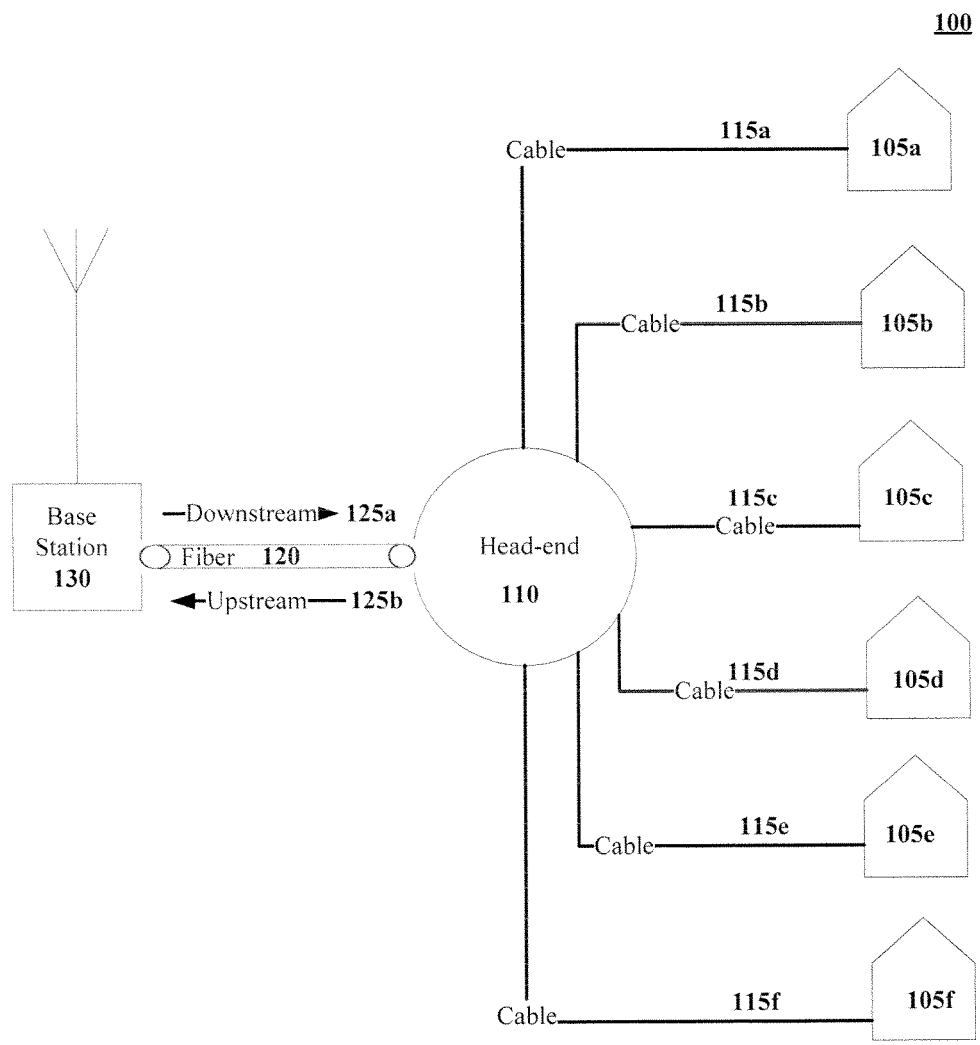
FIG. 1 illustrates a communications network, where the present disclosure is applicable, in one aspect.

Systems and methods in accordance with various embodiments of the present disclosure overcome one or more of the aforementioned and other deficiencies experienced in conventional approaches to calibrate transceivers in communication networks. Embodiments herein provide a method for transceiver calibration using deterministic and statistical methods with a pre-calibration process. Pertinently, the disclosure herein configures components of a transceiver circuit to perform functions that calibrate the transceiver circuit. Typical components configured in the transceiver circuit of the present disclosure include a digital to analog converter (DAC), in one aspect.

The present disclosure, in one example, is applicable in upstream telecommunications for terrestrial, satellite, or cable television. The calibration method and system disclosed herein enables high performance in current-steering for DACs, in one aspect. The performance of a system incorporating the present disclosure may be evaluated using a signal-to-noise-and-distortion ratio (SNDR), which relies on a statistically equi-probable random sampling of a race condition between the clock signal and the input data. In the cable television network, a television tuner includes paths for downstream data, referring to the capture and display of cable/satellite signal, and to upstream data, referring to the communication and transmission of information from costumers to the service providers.

In one example, the present disclosure is applied to the DAC component of an upstream cable television path. The upstream path may be implemented in accordance with a Data Over Cable Service Interface Specification standard, also referred to as the DOCSIS standard. The DOCSIS standard implements high quality and high speed DAC to convert fast digital signal to its analog counterpart. Design of high quality and high speed DAC, of the present disclosure, accounts for low performance of DACs from current-source cell mismatch (also referred to as a static error), timing errors (also referred to as dynamic errors), low output impedance of the current sources, process errors, voltage supply errors, temperature variations, clock feed-through errors, among other related errors. In order to mitigate the impact of these factors on the performance of DAC, several constituent calibration techniques are incorporated herein—including pre-calibration, dynamic calibration, and static calibration.

The calibration techniques of the present disclosure can be categorized into background and foreground calibration techniques to distinguish when the correction occurs—either in the beginning or during the operation of DAC, respectively. The present disclosure is applicable to both, static and dynamic errors, and resolves these errors significantly in a background calibration manner.

A DAC circuit typically includes multiple switch components, such as flip-flops or registers, which are also referred to herein as electronic elements. The switch components may be subject to time mismatch issues when switching to provide the analog output signals of the DAC, based on the digital input signals. The mismatch may be a time delay resulting in erroneous analog output. For example, a digital input using binary form <00 . . . 10> may cause a large analog output as a result of a slight delay when the digital input is applied in parallel across multiple switches. In a current-based DAC, this slight delay in digital input between switches may result in a high current output and, thereby, incorrect conversion from the digital signal. Accordingly, small timing delays severely limit the speed of the DAC. The faster the switching, therefore, the higher is the possibility of a mismatch.

The present disclosure is capable of detecting timing errors in the scale of sub-pico-seconds, and is capable of reducing its impact on the performance of high quality, high speed current steering DACs. The present disclosure also targets the static errors and compensates them by using a current mode analog to digital converter (ADC) as optional parts of the DAC system. The ADC is controlled by a successive approximation algorithm, which is capable of compensating the static errors efficiently. In one aspect, the present disclosure utilizes a random or jitter signal, which may be generated as a noise-like signal, also referred to herein as an artificial-jitter, a jitter, or jitter signal. A jitter is typically a deviation from a periodic signal. A random jitter is a random deviation using a random seed value input, while a uniform jitter is a predefined deviation. Using this artificial-jitter, a randomly sampled set of input signals are modified, and a count is performed for a result of a rat race between the clock and the randomly sampled input signals. The rat race is also referred to herein as a race condition, in which two signals expected at a circuit point at a concurrent time, instead, arrive with a time variations. The time variations can cause output variations as a result, in the case of a signal converter, such as the DAC. The count for the rat race between the clock and the randomly sampled input signals provides results that are compared in a predetermined time interval. The information gleaned from the comparison is then applied to calibrate the circuit at issue. The present disclosure is capable of detecting sub-100 femto-second timing errors.

The present disclosure is applied in an optional two-step process, with each step available independently or combined, as required. The two-step process also addresses static mismatch among the cells in the DAC architecture, in one aspect. For example, the two-step process utilizes a statistical algorithm to predict and reduce the dynamic errors, including delay errors, in one aspect.

FIG. 1 illustrates a communications network 100, where the present disclosure is applicable, in one aspect. The communications network 100 includes at least a base station 130, a head-end 110, and subscriber facilities 105a-f. The base station 130 is typically in communication with the head-end via fiber 120, although other communication systems, including physical and virtual (e.g., wired and wireless) systems may connect the base station 130 to the head-end 110. The head-end is in communication with the subscriber facilities 105 via cable 115a-f, although other communication systems, including fiber (similar to the base station's connection with the head-end), or other physical and virtual (e.g., wired and wireless) stems may connect the head-end 110 to the subscriber facilities 105. The communications network 100 supports upstream and downstream traffic via both the fiber 125—where the traffic is illustrated as element numeric 125a-b, and the cable 115.

The subscriber facilities 105 include modems and, optionally, routers, both of which may be wired or wireless type devices. The upstream and downstream signals from cable 115 transmit digital signals carrying data for voice, telephony, television, and other services, over radio frequency (RF) carrier signals to the modem. In a two-way communication network, one or more carrier signals are designated to transmit data in the downstream direction, from the head-end to the modem at a subscriber facility 105, while other carrier signals are designated to transmit data in the upstream direction, from the subscriber facility 105 to upstream components in the communications network 100, e.g., the head-end 110, and subsequently, the base station 130. The modems at each subscriber facility 105 convert the data as required for the upstream or downstream transmission—for e.g., from a digital format to a RF modulated signals in the upstream direction into the communications network 100, and from RF signals to digital format for the downstream direction consuming devices. A cable modem termination system (CMTS) performs the opposite operation for multiple subscribers at the cable operator's head-end.

The downstream and upstream transmissions can occur in, for example, a 6 MHz bandwidth channel. As described above, the downstream portion is designated to a predetermined portion of the available bandwidth, with the upstream portion designated to the remainder. Moreover, subscriber facilities that are condominium-styled facilities are designated to share bandwidth from singular cables, in some instances. The use of converter circuits, including DAC and ADC circuits, are prevalent in these networks and fast switching enables improved performance and speed with respect to signaling through these circuits.

Figure 2:
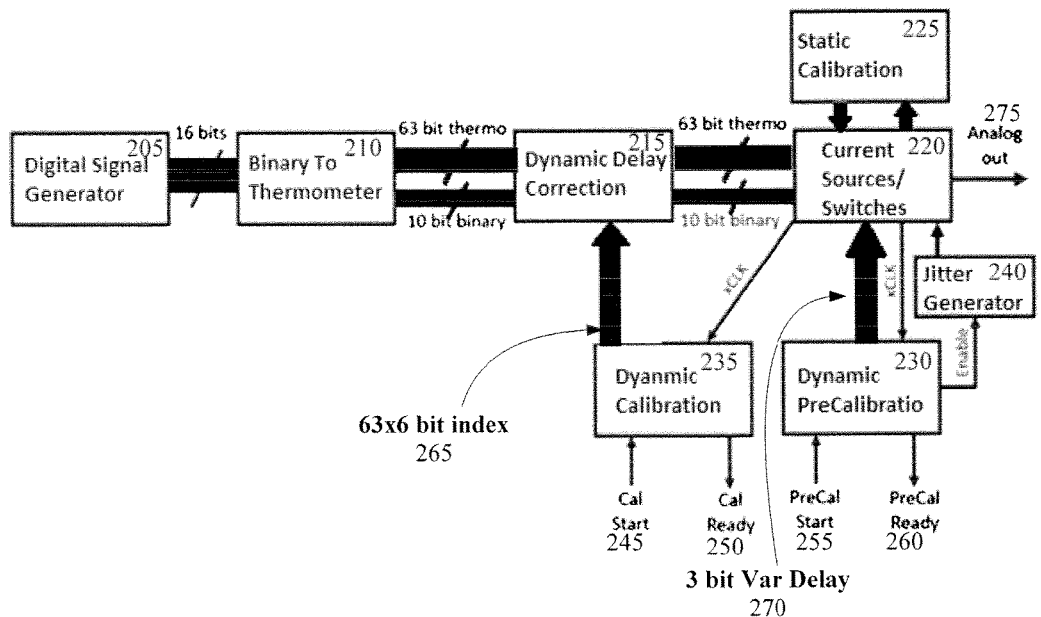
FIG. 2 is a block diagram of a digital to analog converter (DAC) which forms part of the transceiver circuit and embodies the present disclosure, in another aspect.

FIG. 2 is a block diagram of a digital to analog converter (DAC) 200 which forms part of the transceiver circuit and embodies the present disclosure, in an aspect. FIG. 2 illustrates an overall block diagram of the DAC with both, static and dynamic calibration blocks shown. In the static calibration technique phase, a 6-bit current-based analog-to-digital converter (ADC) is used with a digital signal processing (DSP) core. The DSP core is responsible for comparing the output current of each current cell with a reference cell and to compensate the difference using ADC current cells. A successive approximation technique that is generally known to a person of ordinary skill is applicable to facilitate the static calibration technique.

The DAC disclosure of FIG. 2 includes a digital signal generator 205 of the DSP core for providing a 16 bit digital signal (10 bit binary and 6 bit thermometer code) to the thermometer encoder 210. The thermometer encoder codes the digital signal as thermometer coded DAC. The thermometer coded digital signals may utilize a randomizing of the digital signals in order to eliminate the mismatch errors. Pertinently, the thermometer coded digital signals are provided in a 63 bit bus to the dynamic delay correction block 215. A pass-through path provides a 10 bit binary signal to the dynamic delay correction block 215. As discussed in further detail, below, the present system provides components that allow for bypassing of the dynamic calibration if an external request is triggered. Alternatively, if the system of FIG. 2 is functioning as expected, the dynamic calibration may be bypassed. The thermometer coded signals are randomized or scrambled to ensure that they arrive at intended times for analog conversion, thereby resolving timing errors. The scrambling is performed using a stored index that is provided after the dynamic calibration is competed. For example, the index is calculated using a race condition count. The race condition is based at least in part to a rat race between a clock signal and an input signal that has been sampled by a random signal. The index is stored as corresponding to a relative timing error between the clock signal and the sampled input signal FIG. 2 illustrates that the dynamic delay correction block 215 passes corrected signals in 63 bit thermometer code and 10 bit binary code to the current sources/switches 220 that form the analog converter portion of the DAC 200. A static calibration block 225 provides static calibration to allow the current sources/switches 220 to provide uniform and expected output current by supplementing the output current of each current cell with any difference using ADC current cells of the static calibration block 225. Also included in the DAC 200 are a dynamic pre-calibration block 230 (also referred to herein as the PreCal), the dynamic calibration block 235 and the jitter generator 240. The pre-calibration block 230 ensures that the xCLK signal provided for the current sources/switches block 220 is synchronized with the jitter signal of the jitter block 240. Pertinently, pre-calibration block 230 is responsible to shift the generated jitter signal, to synchronize it to the xCLK clock signal. This implementation uses a current steering structure where a set of thermocoded signals generated by the digital signal generator 205 effectively steer currents to provide the analog signal when the currents are added. The switches 220 incorporate a relative timing error as previously described and as sought to be resolved in the present method and system. A part of the correction is via 3 bit variable delay signal 270 that is provided from the pre-calibration block 230 to the current sources/switches block 220 to correct any variations of the jitter signal when the jitter signal is provided via the jitter generator 240.

FIG. 2 also illustrates that the dynamic calibration block 235 implements a statistical algorithm using controllable jitter, from jitter generator 240, which is in a rat race configuration with the xCLK clock signal. The race condition in the rat race configuration is applicable to predict the delays among the current sources/switches 220. The current sources/switches 220 are also referred to herein as cells or electronic elements. The controllable jitter may be obtained by sampling a controlled input signal using the jitter signal. The delays in the electronic elements that may be resolved in the present method and system are timing delays beginning from more than 1 femtosecond. The sensing of delay is, therefore, achieved via the above described statistical technique and may be additionally based in part on the result of delay time sensors.

Figure 3:
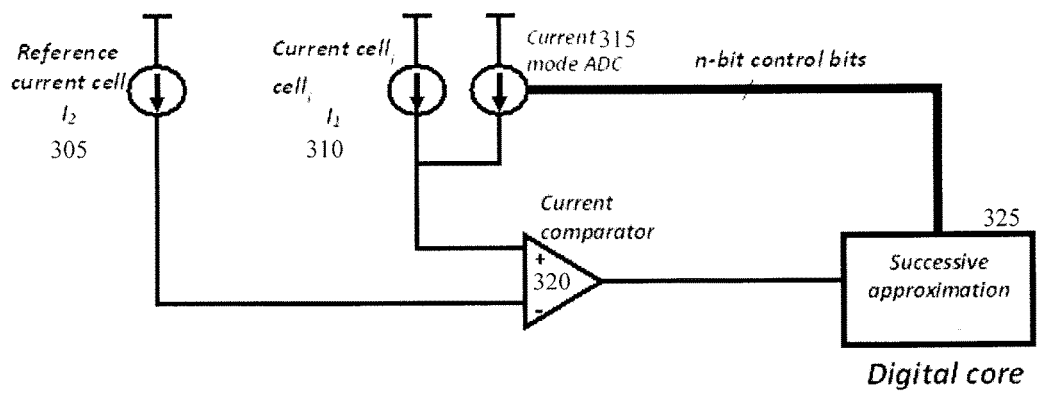
FIG. 3 is a block/circuit shorthand diagram of static calibration components in accordance with an aspect of the present disclosure.

FIG. 3 is a block/circuit shorthand diagram of static calibration components 300 in accordance with an aspect of the present disclosure. As to the static calibration, in the block/circuit shorthand diagram 300, the reference current ($I_2$) is provided from reference current source 305. The reference current ($I_2$) is slightly larger than the applied current $I_1$ of current source cells 310, such that $I_2-I_1=\delta I>0$. "$\delta I$" stands for the delta or difference in the reference current to the applied current of the one or more current source cells 310. The full range of the additive current in the binary-weighted current mode ADC is from 0 to twice the difference (or [0 . . . 2 $\delta I$]), which represents corrections and compensations to current source cells that are within |2−δ| to |2−δ| of the current difference. Initially the ADC control bit is set to the middle of a binary bit value <"1 0 . . . 0">, with one control bit located at the MSB location. The successive approximation block 325, referenced above, compensates the mismatch between the current sources and the reference cells with high accuracy. This successive approximation block 325 implements an algorithm via the digital core (referenced as DSP of FIG. 2) that is capable of compensating static errors within [−δI, δI] interval. Using process variation data from the static calibration, 99% efficiency may be achieved for the current mismatch correction for the current sources/switches block 220 of FIG. 2. The n-bit control from the ADC 315 provides control to compensate the current difference from the compared current at comparator 320, using the ADC current cells to resolve the current difference over successive cycles.

Figure 4:
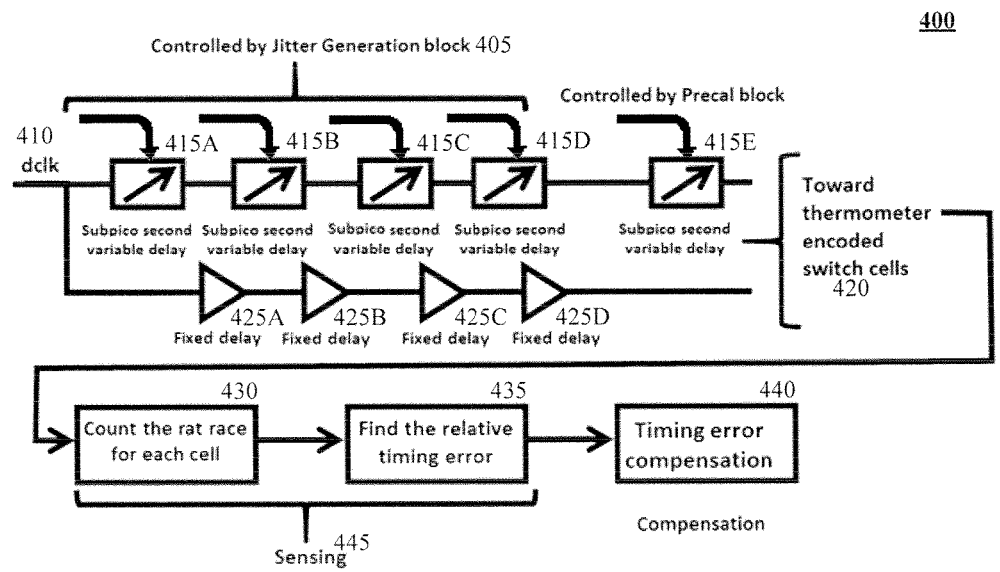
FIG. 4 is a block flow diagram illustrating blocks responsible for resolving statistical timing error by compensation via the calibration features of the present disclosure, in yet another aspect.

FIG. 4 is a block flow diagram illustrating blocks 400 responsible for resolving statistical timing error by compensation via the calibration features of the present disclosure, in yet another aspect. The dynamic calibration is a statistical algorithm, in one aspect. The statistical algorithm uses controllable jitter signals, controlled via jitter generator 405 (block 240 in FIG. 2), in a rut-race configuration with the clock 410 (illustrated as providing the dclk signal), to predict the delay among cells 415/425 (illustrated in symbolic format as serial fixed delays 425 and serial variable delays 415). As noted above, the delay in the cells 415/425 that may be resolved in the present method and system are timing delays beginning from more than 1 femtosecond. The DSP core, in an aspect, consists of pre-calibration and calibration core blocks, along with the jitter generation block 405.

FIG. 4 illustrates four variable delay cells 415A-D that are responsible for generating a jitter delayed signal from a digital clock signal (dclk) 410. The dclk signal may be from a high speed clock of the system. The dclk signal from point 410 also passes through a fixed delay path, including cells 425A-D, to generate the fixed delayed signal that compensates for the average delay of the jittery signal path via cells 415A-E. The last variable delay cell 415E on the jitter signal path provides a degree of freedom to set the fixed delay clock signal to be right of the center of the jitter delayed dclk signal. This is done in the pre-calibration phase, in one aspect of the present disclosure. The analog design phase of the fixed delay 425A-D and the variable delay cells 415A-E are based on minimizing the difference between the average of jitter delayed dclk signal and the fixed delay dclk signal.

Figure 5:
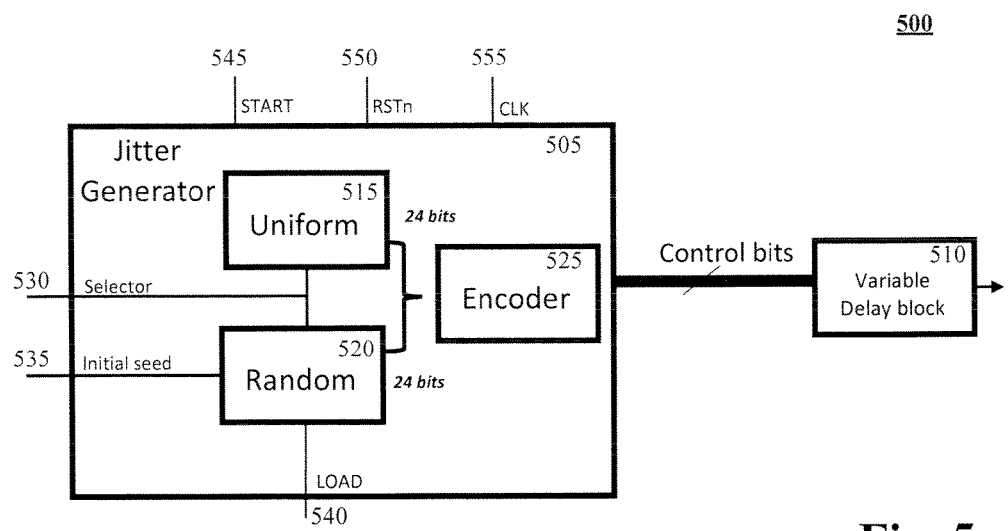
FIG. 5 is a block diagram of a random or jitter signal generator, in accordance with an aspect of the present disclosure.

FIG. 5 is a block diagram of a jitter generator 400, in accordance with an aspect of the present disclosure. The random signal block is a jitter generator 505 in an aspect of the disclosure. The jitter generator 505 of FIG. 5 also corresponds to the feature in block 240 of FIG. 2. The jitter generator 505 controls the jitter signal in an aspect of the disclosure. The jitter signal can be provided using corresponding algorithms and the circuit block components 515-525. FIG. 5 illustrates a randomizer block 520 that uses an initial seed from source 535 and a load initializing signal from 540 to initiate the provisioning of a 24 bit randomized signal to encoder block 525. Jitter generator block 505 includes inputs for a starting, resetting, and clocking for the block 545-555. The random signal is also referred to herein as a random jitter signal. The uniform signal block 515 is configured to generate a uniform jitter signal. In an implementation, the randomizer block 520 uses a 25 bit linear feedback shift register (LFSR) for generation of the random jitter signal. The seed is a 25 bit number that should be assigned in the loading phase using I²C interface (via initial seed input 535) that is triggered via the load signal input 540. The 24 selected bits are encoded to 8 sets of 8 bit control signals. These 8 bit control signals control variable delay block 510 and generate the jitter signal with sub picosecond standard deviation. A selector is available to switch, via selector input 530, between the uniform and random jitter generators 515-520, before the random/uniform jitter signal is encoded in encoder 525 to provide the control bits for the variable delay block 510 (also element 415 of FIG. 4) to generate the jitter signal.

Figure 6:
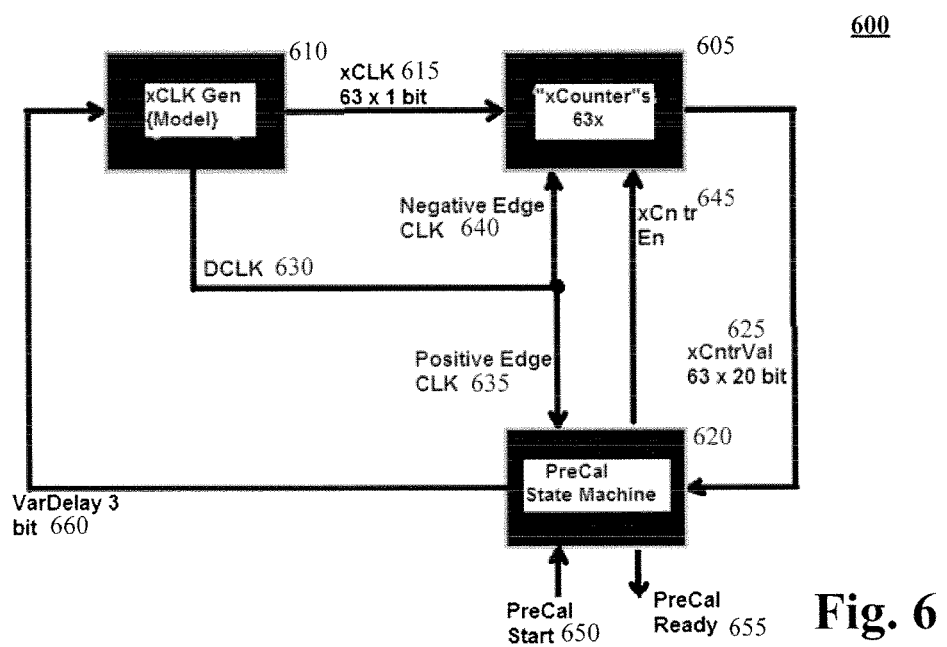
FIG. 6 is a block diagram of a state machine for pre-calibration, clock generator, and counter, in accordance with another aspect of the present disclosure.

FIG. 6 is a block diagram of a state machine 600 for pre-calibration, clock generator, and for counters, in accordance with another aspect of the present disclosure. The state machine 600, illustrates the initial phase of the dynamic calibration method, where synchronization is performed for the clock signal xCLK and an input signal that is sampled by the jitter signal. The clock signal (xCLK), from clock generator 610, passes through fixed delay buffers (illustrated as elements 425 of FIG. 4) to be in phase with generated jitter signal. This is illustrated by the digital (e.g., system) clock dclk 630 applied to the clock generator 610. Variable delay is provided, as illustrated by elements 415 of FIG. 4 and signal VarDelay 660, to the path of the jittered clock signal, via the pre-calibration block 620. The flow of the state machine 600 illustrates the identification process for the closest synchronized point of the thermometer coded signal to the clock xCLK and to freeze or store the control bits as an index in a register at which the closest synchronization point is achieved. In the dynamic calibration phase, the variable delay block has a fixed constant delay and cannot be changed, in an aspect of the disclosure.

Figure 7:
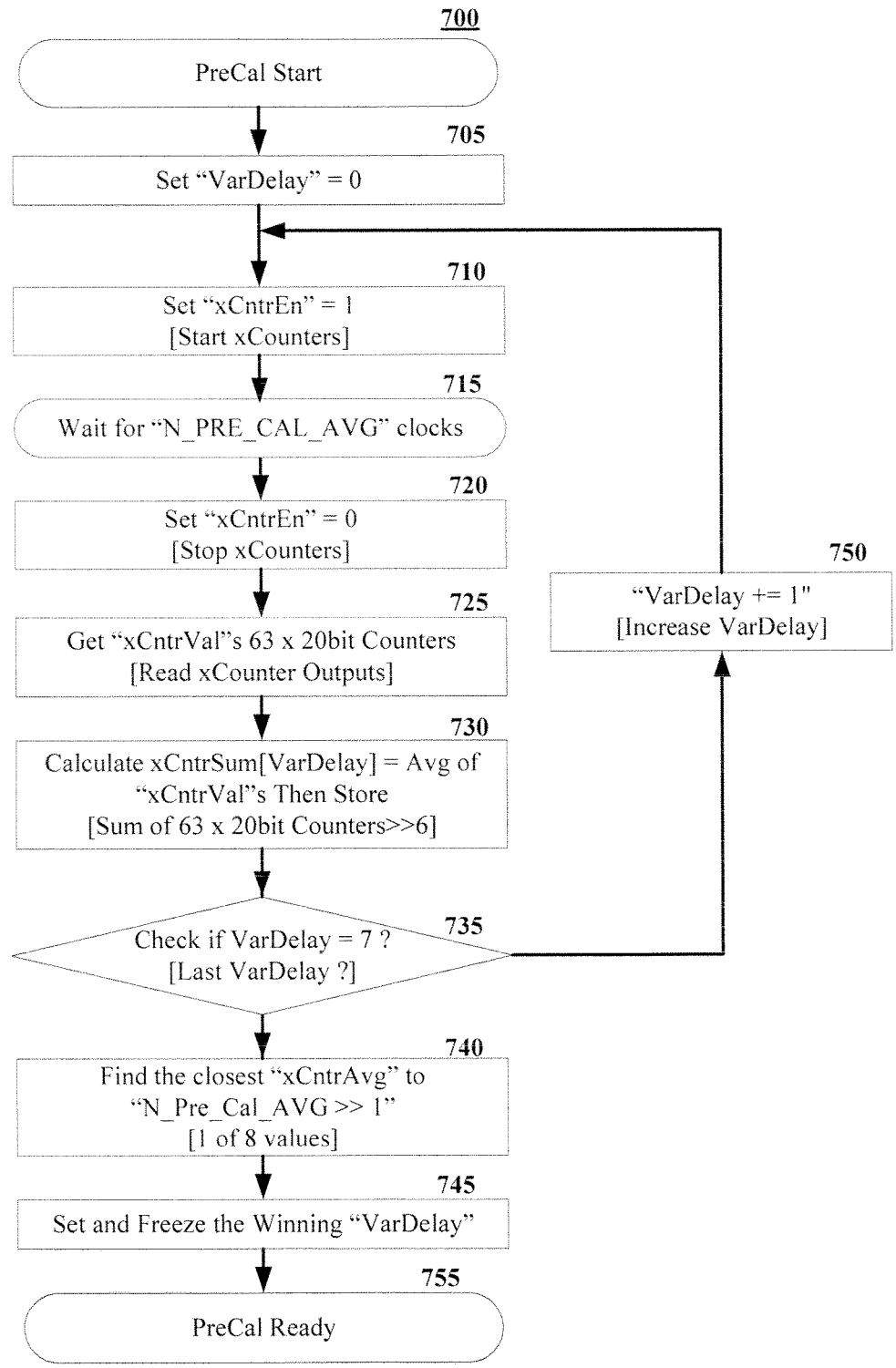
FIG. 7 is a flow diagram for pre-calibration as implemented by a state machine, in accordance with another aspect of the present disclosure.

FIG. 7 is a flow diagram for pre-calibration 700 as implemented by a state machine, in accordance with another aspect of the present disclosure. The pre-calibration 700, in one instance, may be implemented via the state machine of FIG. 6. The flow diagram for pre-calibration 700 begins with setting of the VarDelay value to numeric 0 at block 705. In block 710, the xCounters values are set to numeric 1. In block 715, a wait is provided to process the race conditions for counting in the system. Block 720 stops the xCounters by stopping an enable signal to the counter—e.g., when the enable signal is "0." Block 725 enables the system to read the xCounter outputs, while block 730 provides a sum of the xCounters. Block 735 checks when the VarDelay is 7, and increments VarDelay to repeat the xCounters in block 710. In the event that VarDelay is cycled 7 times, the closest synchronized point of the thermometer coded signal to the clock xCLK is selected and set for freezing as the index. The pre-calibration, as implemented in block 700, is responsible to sense the delay between a jitter sampled input signal and the clock signals, and to then encode them using an optimum algorithm for high performance. In an implementation, the optimum index mapping algorithm includes sorting the stored indices, initiating the encoding process, starting from the largest of the sorted indices and the smallest, followed by the second largest and the second smallest and carrying on till the sorted indices are completely incorporated in the encoding. The output encoded signals are used as index in the next block, which is dynamic delay correction.

Figure 8:
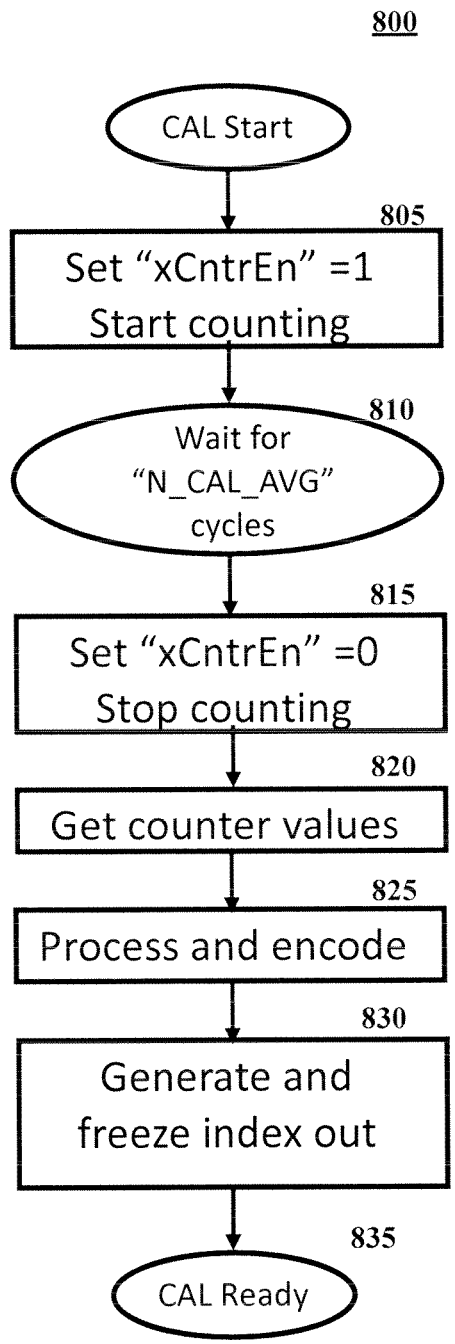
FIG. 8 is a flow diagram for dynamic calibration of a transceiver in an aspect of the present disclosure.

FIG. 8 is a flow diagram 800 for dynamic calibration of a transceiver in an aspect of the present disclosure. FIG. 8 follows the completion of the pre-calibration implementation of FIG. 7. In FIG. 8, counting starts in block 805, then a cycling of the system (block 810) allows for the clocks and signals to settle before the race condition is determined and the counts are incremented. The counting is stopped in a pre-determined time period via block 815. In block 820, the counter values are secured and are processed and encoded via block 825. The control bits are indexed and stored via block 830, representing the calibrated system and are used in subsequent input signal to ensure that timing errors are compensated. In case of similar path delays, in the present system, one of the paths is randomly selected as the winner path. For example, sorting as in the manner described above is applied to the stored indices for selection in response to the calibration requirements, but in another implementation, when the indices are similar, then random sorting processes are followed.

Figure 9:
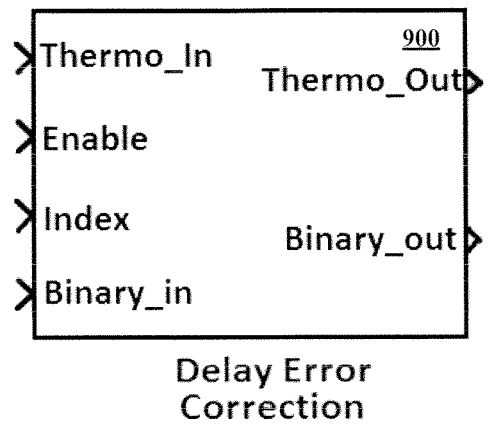
FIG. 9, in one aspect, is a block diagram illustrating delay or timing error correction of the present disclosure.
Figure 10:
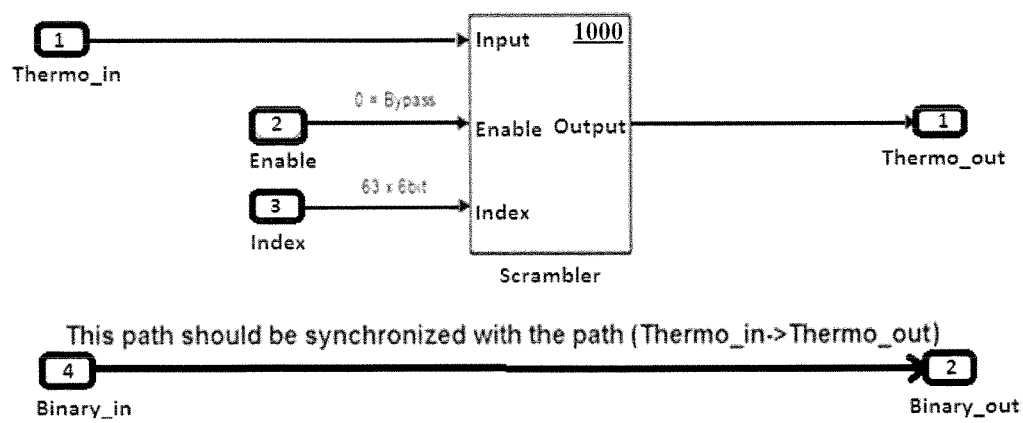
FIG. 10, in another aspect, is a block diagram illustrating a thermometer coder in a digital to analog converter of the present disclosure.

FIG. 9, in one aspect, is a block diagram 900 illustrating delay or timing error correction of the present disclosure. In an implementation, the block diagram 900 is part of a semiconductor integrated circuit chip. The block diagram 900 includes input pins for thermometer coded input, index code input, binary input, thermometer output, and binary output. Block diagram 900 additionally includes an enable pin to enable error correction when a timing mismatch is sensed in the system. FIG. 10, in another aspect, is a block diagram 1000 illustrating an implementation of a scrambler circuit (e.g., a thermometer coder in the DAC) of the present disclosure. Further, in an aspect the block diagram 1000 can be part of the semiconductor integrated circuit chip including the features in block diagram 900 of FIG. 9. Alternatively, the block diagram 1000 represents a separate semiconductor integrated circuit chip coupled to the chip incorporating the features in block diagram 900. In an alternate implementation for the delay error correction, the scrambler chip 1000 includes input pins for thermometer coded input, index code input, and thermometer output. The scrambler chip 1000 additionally includes an enable input to enable the use of the scrambler to resolve mismatch errors in the thermometer code. In the event that scrambling is not required, the enable pin may be isolated (unasserted) or bypassed by an appropriate bypass signal, such that the binary input is passed to the binary output—illustrated as a bypass from pin (4) to output pin (2) of scrambler 1000. Pertinently, the bypass to the scrambler applies only to the thermometer code passing through the scrambler 1000. As the delay for both the thermometer and binary codes are expected to be the same, the consequence of no delay with trigger the bypass at the bypass enable pin of the scrambler only for the thermometer coded bits as pin 4 illustrates that the binary bits will already bypass the scrambler.

In a DAC, the signal path through the converter may be randomized in order to remove mismatch errors from the DAC weights using binary signals. As thermometer coded DAC uses equal weights, it may be suitable in the present implementation so long as the timing is resolved by the stored index for calibration. Pertinently, as all bits of the thermometer coded DAC are weighted equally, the randomization does not affect the output; instead, multiple combinations of thermometer code may represent the same binary value and provide the same output. The calibration index stored in the present disclosure enables the use of required weights assigned to the thermometer code at different instances of time to enable a matched output. The scrambler chip enables such an application for the calibrated system herein.

Figure 11:
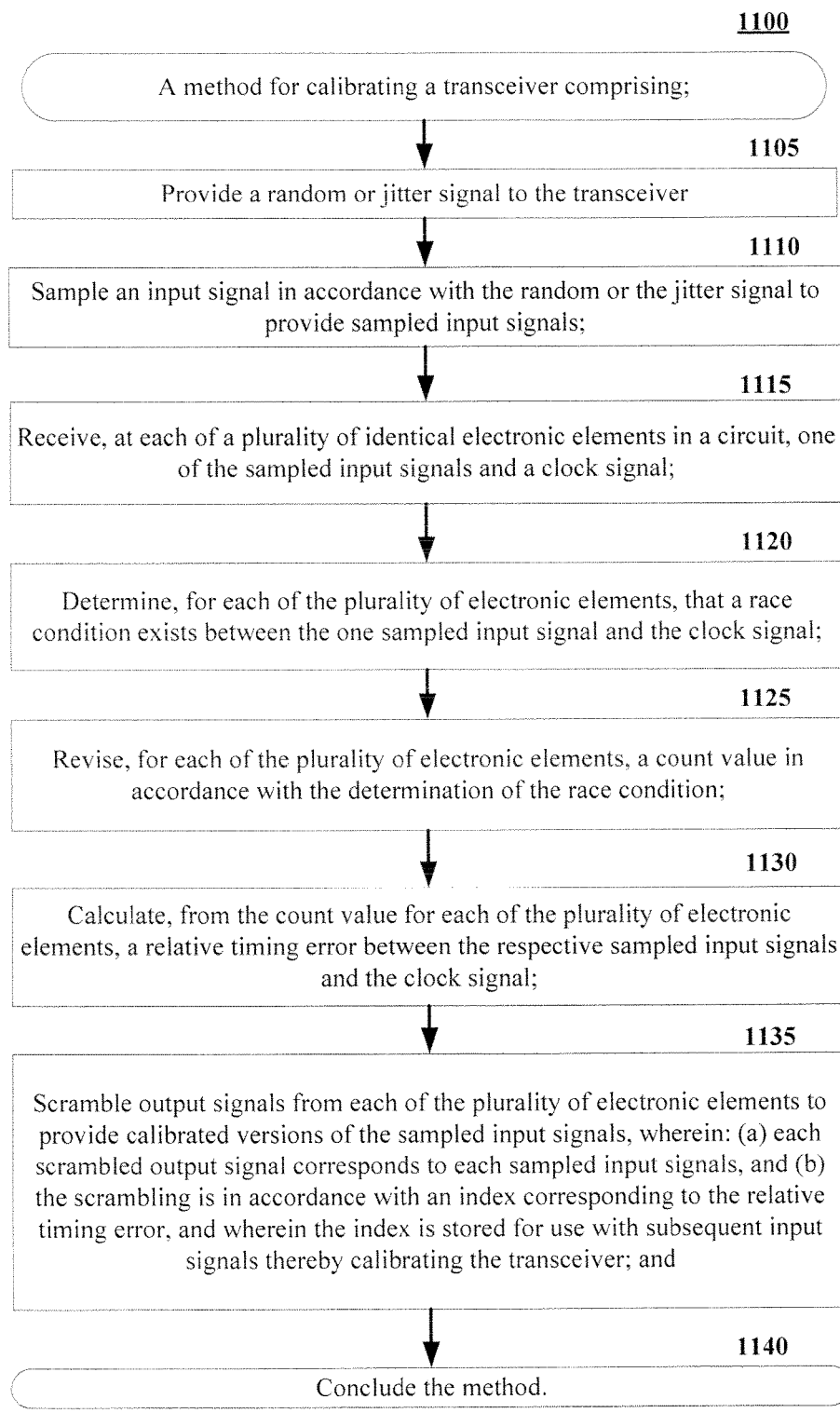
FIG. 11 is a flow diagram for calibration of a transceiver in another aspect of the present disclosure.

FIG. 11 is a flow diagram for calibration of a transceiver 1100 in another aspect of the present disclosure. The method includes providing a random signal to the transceiver via block 1105. A sampling is performed, via block 1110, for an input signal in accordance with the random signal to provide sampled input signals. A receiving step of block 1115 is applied at each of a number of electronic elements in a circuit to receive one of the sampled input signals and a clock signal. A determining function is conducted via block 1120, for each of the plurality of electronic elements, to determine that a race condition exists between the one sampled input signal and the clock signal. Revision is applied via block 1125 to a count value in accordance with the determination of the race condition for each of the plurality of electronic elements. A calculation is applied via block 1130, from the count value for each of the plurality of electronic elements, to determine a relative timing error between the respective sampled input signals and the clock signal. A scrambling is performed, using block 1135, for the output signals from each of the electronic elements to generate calibrated versions of the sampled input signals. Pertinently, block 1135 ensures that each scrambled output signal corresponds to each sampled input signals and the scrambling is in accordance with an index corresponding to the relative timing error. In block 1135, the index is stored for use with subsequent input signals, thereby calibrating the transceiver. Block 1140 concludes the method for calibrating the transceiver 1100.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to dynamicaly calibrate transceivers using novel integrated circuits and algorithms.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infrared network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for calibration of a transceiver comprising:
providing a jitter signal to the transceiver;
sampling an input signal in accordance with the jitter signal to provide a sampled input signal;
receiving, at an electronic element in the transceiver, the sampled input signal and a clock signal;
determining that a race condition exists between the sampled input signal and the clock signal;
revising a count value in accordance with the determination of the race condition;
calculating, from the count value, a relative timing error between the sampled input signal and the clock signal; and
scrambling an output signal from the electronic element to provide scrambled output signal, the scrambling in accordance with an index corresponding to the relative timing error, the index stored for use with subsequent input signals to the transceiver.

2. The method of claim 1, wherein the providing for the jitter signal is by a signal generator that is configured to add randomness to the clock signal using a seed number input from a register.

3. The method of claim 1, wherein the providing for the jitter signal is by a signal generator that is configured to add noise to the clock signal using a linear feedback shift register (LFSR).

4. The method of claim 1, wherein the determination of the race condition is performed by a comparison of receipt times of edges of the sampled input signal and the clock signal, and the comparison occurring when the sampled input signal and the clock signal are active in a predetermined time interval.

5. The method of claim 4, wherein the determination of the race condition further comprises using a sub-pico second difference in the comparison of the receipt times of the edges of the sampled input signal and the clock signal.

6. The method of claim 1, wherein the electronic element is one among flip-flops or registers.

7. The method of claim 1, wherein the sampled input signal and the output signal are thermometer-coded signals.

8. The method of claim 1, wherein the index maps the sampled input signal and the output signal.

9. The method of claim 1, wherein the index comprises code for controlling signal selection to output the scrambled output signal.

10. The method of claim 1, further comprising: pre-calibrating of the clock signal and the input signal to synchronize the clock signal and the input signal.

11. A transceiver circuit, comprising:
a signal generator for providing a jitter signal;
a sampler circuit for sampling an input signal in accordance with the jitter signal to provide a sampled input signal;
an electronic element in the transceiver circuit, receiving the sampled input signal and a clock signal;
a sensor circuit for determining that a race condition exists between the sampled input signal and the clock signal;
the sensor circuit for revising a count value in accordance with the determination of the race condition;
the sensor circuit for calculating, from the count value, a relative timing error between the respective sampled input signals and the clock signal; and
a scrambler circuit for scrambling an output signal from the electronic element to provide a scrambled output signal, the scrambling in accordance with an index corresponding to the relative timing error, the index stored for use with subsequent input signals to the transceiver.

12. The transceiver circuit of claim 11, wherein the signal generator is configured to add randomness to the clock signal using a seed number, from a register, for the providing of the jitter signal.

13. The transceiver circuit of claim 11, wherein the signal generator is configured to add noise to the clock signal using a linear feedback shift register (LFSR), for the providing of the jitter signal.

14. The transceiver circuit of claim 11, wherein the sensor circuit is configured for the determining of the race condition by comparing receipt times of edges of the sampled input signal and the clock signal, the comparing performed when the sampled input signal and the clock signal are active in a predetermined time interval.

15. The transceiver circuit of claim 14, wherein the sensor circuit is configured for the comparing of the receipt times using a sub-pico second difference in the receipt times of the edges of the sampled input signal and the clock signal.

16. The transceiver circuit of claim 14, wherein the electronic element is one among flip-flops or registers.

17. The transceiver circuit of claim 14, wherein the sampled input signal and output signal are thermometer-coded signals.

18. The transceiver circuit of claim 14, wherein the index maps the sampled input signals and the output signals.

19. The transceiver circuit of claim 14, wherein the index comprises code for controlling signal selection to output the scrambled output signal.

20. The transceiver circuit of claim 14, further comprising a pre-calibration circuit for pre-calibration of the clock signal and the input signal to synchronize the clock signal and the input signal.

* * * * *